(12) United States Patent
Lochtefeld

(10) Patent No.: US 7,799,592 B2
(45) Date of Patent: Sep. 21, 2010

(54) TRI-GATE FIELD-EFFECT TRANSISTORS FORMED BY ASPECT RATIO TRAPPING

(75) Inventor: Anthony J. Lochtefeld, Somerville, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 482 days.

(21) Appl. No.: 11/861,931

(22) Filed: Sep. 26, 2007

(65) Prior Publication Data

US 2008/0073667 A1 Mar. 27, 2008

Related U.S. Application Data

(60) Provisional application No. 60/847,424, filed on Sep. 27, 2006.

(51) Int. Cl.
*H01L 21/00* (2006.01)

(52) U.S. Cl. .............. 438/44; 438/283; 438/481; 257/185; 257/188; 257/189; 257/190; 257/E33.005; 257/E29.246; 257/E29.298; 257/E21.097; 257/E21.102; 257/E21.133; 257/E21.403; 257/E21.562

(58) Field of Classification Search ............... 438/44, 438/283, 481; 257/190
See application file for complete search history.

(56) References Cited

U.S. PATENT DOCUMENTS

| | | | |
|---|---|---|---|
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa | |
| 4,826,784 A | 5/1989 | Salerno et al. | |
| 4,860,081 A | 8/1989 | Cogan | |
| 4,876,210 A | 10/1989 | Barnett et al. | |
| 4,948,456 A | 8/1990 | Schubert | |
| 5,032,893 A | 7/1991 | Fitzgerald, Jr. et al. | |
| 5,034,337 A | 7/1991 | Mosher et al. | |
| 5,061,644 A | 10/1991 | Yue et al. | |
| 5,091,333 A | 2/1992 | Fan et al. | |
| 5,091,767 A | 2/1992 | Bean et al. | |
| 5,093,699 A | 3/1992 | Weichold et al. | |

(Continued)

FOREIGN PATENT DOCUMENTS

EP 1 551 063 7/2005

(Continued)

OTHER PUBLICATIONS

68 Applied Physics Letters 7, pp. 774-779 (1999). (trans. of relevant portions attached).

(Continued)

*Primary Examiner*—Charles D Garber
*Assistant Examiner*—Yasser A Abdelaziez
(74) *Attorney, Agent, or Firm*—Slater & Matsil, L.L.P.

(57) ABSTRACT

Semiconductor structures include a trench formed proximate a substrate including a first semiconductor material. A crystalline material including a second semiconductor material lattice mismatched to the first semiconductor material is formed in the trench. Process embodiments include removing a portion of the dielectric layer to expose a side portion of the crystalline material and defining a gate thereover. Defects are reduced by using an aspect ratio trapping approach.

23 Claims, 5 Drawing Sheets

U.S. PATENT DOCUMENTS

| | | | |
|---|---|---|---|
| 5,098,850 A | 3/1992 | Nishida et al. |
| 5,105,247 A | 4/1992 | Cavanaugh |
| 5,156,995 A | 10/1992 | Fitzgerald, Jr. et al. |
| 5,166,767 A | 11/1992 | Kapoor et al. |
| 5,236,546 A | 8/1993 | Mizutani et al. |
| 5,238,869 A | 8/1993 | Shichijo et al. |
| 5,256,594 A | 10/1993 | Wu et al. |
| 5,269,852 A | 12/1993 | Nishida et al. |
| 5,269,876 A | 12/1993 | Mizutani et al. |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,403,751 A | 4/1995 | Nishida et al. |
| 5,417,180 A | 5/1995 | Nakamura et al. |
| 5,427,976 A | 6/1995 | Koh et al. |
| 5,432,120 A | 7/1995 | Meister et al. |
| 5,438,018 A | 8/1995 | Mori et al. |
| 5,518,953 A | 5/1996 | Takasu et al. |
| 5,589,696 A | 12/1996 | Baba et al. |
| 5,621,227 A | 4/1997 | Joshi |
| 5,640,022 A | 6/1997 | Inai et al. |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,849,077 A | 12/1998 | Kenney |
| 5,886,385 A | 3/1999 | Arisumi et al. |
| 5,953,361 A | 9/1999 | Borchert et al. |
| 5,966,620 A | 10/1999 | Sakaguchi et al. |
| 6,011,271 A | 1/2000 | Sakuma et al. |
| 6,015,979 A | 1/2000 | Sugiura et al. |
| 6,049,098 A | 4/2000 | Sato et al. |
| 6,100,106 A | 8/2000 | Yamaguchi et al. |
| 6,111,288 A | 8/2000 | Watanabe et al. |
| 6,191,432 B1 | 2/2001 | Sugiyama et al. |
| 6,228,691 B1 | 5/2001 | Doyle |
| 6,235,547 B1 | 5/2001 | Sakuma et al. |
| 6,252,261 B1 | 6/2001 | Usui et al. |
| 6,271,551 B1 | 8/2001 | Schmitz et al. |
| 6,320,220 B1 | 11/2001 | Watanabe et al. |
| 6,342,404 B1 | 1/2002 | Shibata et al. |
| 6,348,096 B1 | 2/2002 | Sunakawa et al. |
| 6,362,071 B1 | 3/2002 | Nguyen et al. |
| 6,407,425 B1 | 6/2002 | Babcock et al. |
| 6,475,869 B1 | 11/2002 | Yu |
| 6,492,216 B1 | 12/2002 | Yeo et al. |
| 6,512,252 B1 | 1/2003 | Takagi et al. |
| 6,521,514 B1 | 2/2003 | Gehrke et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,617,643 B1 | 9/2003 | Goodwin-Johansson |
| 6,635,110 B1 | 10/2003 | Luan et al. |
| 6,686,245 B1 | 2/2004 | Mathew et al. |
| 6,710,368 B2 | 3/2004 | Fisher et al. |
| 6,720,196 B2 | 4/2004 | Kunisato et al. |
| 6,727,523 B2 | 4/2004 | Morita et al. |
| 6,753,555 B2 | 6/2004 | Takagi et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 7,061,065 B2 | 9/2004 | Horng |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,495 B2 | 11/2004 | Wada et al. |
| 6,815,241 B2 | 11/2004 | Wang |
| 6,815,738 B2 | 11/2004 | Rim |
| 6,825,534 B2 | 11/2004 | Chen et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka et al. |
| 6,841,808 B2 | 1/2005 | Shibata et al. |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,955,969 B2 | 10/2005 | Djomehri et al. |
| 6,955,977 B2 | 10/2005 | Kong et al. |
| 6,958,254 B2 | 10/2005 | Seifert et al. |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,998,684 B2 | 2/2006 | Anderson et al. |
| 7,001,804 B2 | 2/2006 | Dietz et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green et al. |
| 7,041,178 B2 | 5/2006 | Tong et al. |
| 7,045,401 B2 | 5/2006 | Lee et al. |
| 7,049,627 B2 | 5/2006 | Vineis et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda et al. |
| 7,084,441 B2 | 8/2006 | Saxler |
| 7,087,965 B2 | 8/2006 | Chan et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |

| | | |
|---|---|---|
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 7,344,942 B2 | 3/2008 | Korber |
| 2001/0006249 A1 | 7/2001 | Fitzgerald |
| 2001/0045604 A1 | 11/2001 | Oda et al. |
| 2002/0030246 A1 | 3/2002 | Eisenbeiser et al. |
| 2002/0066403 A1 | 6/2002 | Sunakawa et al. |
| 2002/0070383 A1 | 6/2002 | Shibata et al. |
| 2002/0084000 A1* | 7/2002 | Fitzgerald ............... 148/33.2 |
| 2003/0030117 A1 | 2/2003 | Iwasaki et al. |
| 2003/0045017 A1 | 3/2003 | Hiramatsu et al. |
| 2003/0064535 A1 | 4/2003 | Kub et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0178677 A1 | 9/2003 | Clark et al. |
| 2003/0207518 A1 | 11/2003 | Kong et al. |
| 2004/0012037 A1 | 1/2004 | Venkatesan et al. |
| 2004/0072410 A1 | 4/2004 | Motoki et al. |
| 2004/0075105 A1 | 4/2004 | Leitz et al. |
| 2004/0195624 A1 | 10/2004 | Liu et al. |
| 2004/0227187 A1 | 11/2004 | Cheng et al. |
| 2005/0003572 A1 | 1/2005 | Hahn et al. |
| 2005/0017351 A1 | 1/2005 | Ravi |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1 | 3/2005 | Han |
| 2005/0073028 A1* | 4/2005 | Grant et al. ............... 257/617 |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0127451 A1 | 6/2005 | Tsuchiya et al. |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0212051 A1 | 9/2005 | Jozwiak et al. |
| 2005/0217565 A1 | 10/2005 | Lahreche et al. |
| 2005/0250285 A1* | 11/2005 | Yoon et al. ............... 438/283 |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0105533 A1 | 5/2006 | Chong et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0145264 A1 | 7/2006 | Chidambarrao et al. |
| 2006/0160291 A1 | 7/2006 | Lee et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0267047 A1 | 11/2006 | Murayama |
| 2006/0292719 A1 | 12/2006 | Lochtefeld et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0196987 A1 | 8/2007 | Chidambarrao et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0093622 A1 | 4/2008 | Li et al. |
| 2008/0099785 A1 | 5/2008 | Bai et al. |
| 2008/0187018 A1 | 8/2008 | Li |
| 2009/0039361 A1 | 2/2009 | Li et al. |
| 2009/0065047 A1 | 3/2009 | Fiorenza et al. |

FOREIGN PATENT DOCUMENTS

| | | |
|---|---|---|
| EP | 1796180 | 6/2007 |
| JP | 2-62090 | 3/1990 |
| JP | 02062090 | * 3/1990 |
| JP | 2000-286449 | 10/2000 |
| JP | 2004-200375 | 7/2004 |
| WO | WO-02/086952 | 10/2002 |
| WO | WO 2004/023536 | 3/2004 |
| WO | WO-2005/013375 | 2/2005 |
| WO | WO-2005/048330 | 5/2005 |
| WO | WO-2005/098963 | 10/2005 |
| WO | WO-2005/122267 | 12/2005 |
| WO | WO-2006/125040 | 11/2006 |

OTHER PUBLICATIONS

Asano, T. et al., "AlGaInN laser diodes grown on an ELO-GaN substrate vs. on a sapphire substrate," *2000 IEEE 17th International Semiconductor Laser Conference, Conference Digest.*, pp. 109-110.

Ashby, C.I.H. et al., "Low-dislocation-density GaN from a single growth on a textured substrate." Applied Physics Letters, v 77, n 20, Nov. 13, 2000, p. 3233-35.

Ashley et al., "Heterogeneous InSb Quantum Well Transistors on Silicon for ultra-high speed, low power logic applications," 43 Electronics Letters 14 (Jul. 2007).

Bai et al, "Study of the defect elimination mechanisms in aspect ratio trapping Ge growth," Appl. Phys. Letters, vol. 90 (2007).

Bakkers et al., "Epitaxial Growth on InP Nanowires on Germanium," Nature Materials, vol. 3 (Nov. 2004), pp. 769-773.

Baron et al., "Chemical Vapor Deposition of Ge Nanocrystals on $SiO_2$," Applied Physics Letters, vol. 83, No. 7 (Aug. 18, 2003), pp. 1444-1446.

Beckett et al., "Towards a reconfigurable nanocomputer platform," ACM Int'l. Conf. Proceeding Series, vol. 19, pp. 141-150 (2002).

Beltz et al., "A Theoretical Model for Threading Dislocation Reduction During Selective Area Growth," Materials Science and Engineering, A234-236 (1997), pp. 794-797.

Borland, J.O., "Novel device structures by selective epitaxial growth (SEG)," 1987 International Electron Devices Meeting, pp. 12-15.

Bryskiewicz, T., "Dislocation filtering in SiGe and InGaAs buffer layers grown by selective lateral overgrowth method," Applied Physics Letters, v 66, n 10, Mar. 6, 1995, p. 1237-39.

Bushroa, A.R. et al., "Lateral epitaxial overgrowth and reduction in defect density of 3C-SiC on patterned Si substrates," Journal of Crystal Growth, v 271, Oct. 15, 2004, pp. 200-206.

Cannon et al., "Monolithic Si-based Technology for Optical Receiver Circuits," Proceedings of SPIE, vol. 4999 (2003), pp. 145-155.

Chan et al., "Influence of metalorganic Sources on the Composition Uniformity of Selectively Grown $Ga_xIn_{1-x}P$," Jpn J. Appl. Phys., vol. 33 (1994) pp. 4812-4819.

Chang et al., "Epitaxial Lateral Overgrowth of Wide Dislocation-Free GaAs on Si Substrates," Electrochemical Soc'y Proceedings, vol. 97-21, pp. 196-200.

Chang, Y.S. et al., "Effect of growth temperature on epitaxial lateral overgrowth of GaAs on Si substrate," Journal of Crystal Growth, 174, Apr. 1997, pp. 630-634.

Chau et al., "Opportunities and Challenges of III-V Nanoelectronics for Future High-Speed, Low Power Logic Applications," IEEE CSIC Digest, pp. 17-20 (2005).

Chen, Y. et al., "Dislocation reduction in GaN thin films via lateral overgrowth from trenches," Applied Physics Letters, v 75, n 14, Oct. 4, 1999, p. 2062-63.

Dadgar et al., "MOVPE Growth of GaN on Si (111) Substrates," Journal of Crystal Growth, 248 (2003) pp. 556-562.

Datta et al., "Silicon and III-V Nanoelectronics," IEEE Int'l. Conf. on Indium Phosphide & Related Mat., pp. 7-8 (2005).

Datta et al., "Ultrahigh-Speed 0.5 V Supply Voltage $In_{0.7}Ga_{0.3}As$ Quantum-Well Transistors on Silicon Substrate," 28 Electron Device Letters 8, pp. 685-687 (2007).

Davis, R.F. et al., "Lateral epitaxial overgrowth of and defect reduction in GaN thin films," IEEE Lasers and Electro-Optics Society Annual Meeting, 1998, vol. 1, pp. 360-361.

de Boeck et al., "The fabrication on a novel composite $GaAs/SiO_2$ nucleation layer on silicon for heteroepitaxial overgrowth by molecular beam epitaxy," Mat. Sci. and Engineering, B9 (1991), pp. 137-141.

Dong et al., "Selective area growth of InP through narrow openings by MOCVD and its application to InP HBT," 2003 International Conference on Indium Phosphide and Related Materials, pp. 389-392, May 12-16, 2003.

Dong-Ho Kim et al., "GaN nano epitaxial lateral overgrowth on holographically patterned substrates," International Symposium on Compound Semiconductors, pp. 27-28, Aug. 2003.

Epitaxial Lateral Overgrowth of GaAs on a Si Substrate, 28 Jap. J. App. Physics 3, pp. L337-L339 (Mar. 1989).

Fang et al., "Electrically pumped hybrid AlGaInAs-silicon evanescent laser," 14 Optics Express 20, pp. 9203-9210 (2006).

Feltin, E. et al., "Epitaxial lateral overgrowth of GaN on Si (111)," Journal of Applied Physics, v 93, n 1, Jan. 1, 2003, pp. 182-185.

Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9 (1990), pp. 949-955.

Fitzgerald et al., "Epitaxial Necking in GaAs Grown on Pre-patterned Si Substrates," Journal of Electronic Materials, vol. 20, No. 10 (1991), pp. 839-853.

Fitzgerald et al., "Nucleation Mechanisms and the Elimination of Misfit Dislocations at Mismatched Interfaces by Reduction in Growth Area," J. Applied Phys., vol. 65, No. 6, (Mar. 15, 1989), pp. 2220-2237.

Fitzgerald, "The Effect of Substrate Growth Area on Misfit and Threading Dislocation Densities in Mismatched Heterostructures," J. Vac. Sci. Technol., vol. 7, No. 4 (Jul./Aug. 1989), pp. 782-788.

Gallagher et al., "Development of the magnetic tunnel junction MRAM at IBM: From first junctions to a 16-Mb MRAM demonstrator chip," 50 IBM J. Research & Dev. 1 (2006).

Gallas et al, "Influence of Doping on Facet Formation at the $SiO_2/Si$ Interface," Surface Sci. 440, pp. 41-48 (1999).

Geppert, L., "Quantum transistors: toward nanoelectronics," IEEE Spectrum, pp. 46-51 (Sep. 2000).

Glew et al., "New DFB grating structure using dopant-induced refractive index step," J. Crystal Growth 261 (2004) pp. 349-354.

Gould et al., "Magnetic resonant tunneling diodes as voltage-controlled spin selectors," 241 Phys. Stat. Sol. (B) 3, pp. 700-703 (2004).

Groenert et al., "Monolithic integration of room-temperature cw GaAs/AlGaAs lasers on Si substrates via relaxed graded GeSi buffer layers," 93 J. Appl. Phys. 362 (2003).

Gustafsson et al., "Cathodoluminescence from relaxed $Ge_xSi_{1-x}$ grown by heteroepitaxial lateral overgrowth," J. Crystal Growth 141 (1994), pp. 363-370.

Gustafsson et al., "Investigations of high quality $Ge_xSi_{1-x}$ grown by heteroepitaxial lateral overgrowth using cathodoluminescence," Inst. Phys. Conf. Ser. No. 134: Section 11, pp. 675-678 (1993).

Hayafuji et al., Jap. J. Appl. Phys. 29, pp. 2371 (1990).

Hersee, et al., "The Controlled Growth of GaN Nanowires," Nano Letters, vol. 6, No. 8 (2006), pp. 1808-1811.

Hiramatsu, K. et al., "Fabrication and characterization of low defect density GaN using facet-controlled epitaxial lateral overgrowth (FACELO)," Journal of Crystal Growth, v 221, Dec. 2000, pp. 316-326.

Hollander et al., "Strain and Misfit Dislocation Density in Finite Lateral Size $Si_{1-x}Ge_x$ Films Grown by Sective Epitaxy," Thin Solid Films, vol. 292, (1997) pp. 213-217.

Huang et al., "Electron and Hole Mobility Enhancement in Strained SOI by Wafer Bonding," 49 IEEE Trans. on Electron Devices 9, pp. 1566-1571 (2002).

International Search Report and Written Opinion for Patent Application No. PCT/US2006/019152, dated Oct. 19, 2006.

International Search Report and Written Opinion for Patent Application No. PCT/US2006/029247, dated May 7, 2007.

International Search Report and Written Opinion for Patent Application No. PCT/US2006/033859, dated Sep. 12, 2007.

Ipri, A.C. et al., "Mono/Poly technology for fabricating low-capacitance CMOS integrated circuits," IEEE Trans. on Electron Devices, vol. 35, No. 8, pp. 1382-1383, Aug. 1988.

Ishitani et al., "Facet Formation in Selective Silicon Epitaxial Growth," 24 Jap. J. Appl. Phys. 10, pp. 1267-1269 (1985).

Jing Wang et al., "Fabrication of patterned sapphire substrate by wet chemical etching for maskless lateral overgrowth of GaN," J. Electrochemical Soc'y, v. 153, n. 3, Mar. 2006, pp. C182-C185.

Ju, W. et al., "Epitaxial lateral overgrowth of gallium nitride on silicon substrate," J. Crystal Growth, v. 263, Mar. 1, 2004, p. 30-4.

Kamiyama, S. et al., "UV laser diode with 350.9-nm-lasing wavelength grown by hetero-epitaxial-lateral overgrowth technology," IEEE Journal of Selected Topics in Quantum Electronics, vol. 11, No. 5, pp. 1069-1073, Sep.-Oct. 2005.

Kamiyama, S. et al., "UV light-emitting diode fabricated on hetero-ELO-grown $Al_{0.22}Ga_{0.78}N$ with low dislocation density," Physica Status Solidi A, v 192, n 2, Aug. 2002, pp. 296-300.

Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.

Kidoguchi, I. et al., "Air-bridged lateral epitaxial overgrowth of GaN thin films," Applied Physics Letters, v 76, n 25, Jun. 19, 2000, pp. 3768-3770.

Kimura et al., "Vibronic Fine Structure Found in the Blue Luminescence from Silicon Nanocolloids," Jpn. J. Appl. Physics, vol. 38 (1999), pp. 609-612.

Klapper, "Generation and Propagation of Dislocations During Crystal Growth," Mat. Chem. and Phys. 66, pp. 101-109 (2000).

Knall et al., Threading Dislocations in GaAs Grown with Free Sidewalls on Si mesas, J Vac. Sci. Technol. B, vol. 12, No. 6, (Nov./Dec. 1994) pp. 3069-3074.

Krost et al., "GaN-based Optoelectronics on Silicon Substrates," Mat. Sci. & Engineering, B93 (2002) pp. 77-84.

Kushida, K. et al., "Epitaxial growth of $PbTiO_3$ films on $SrTiO_3$ by RF magnetron sputtering," Ultrasonics, IEEE Transactions on Ferroelectrics and Frequency Control, vol. 38, No. 6, pp. 656-662, Nov. 1991.

Kwok K Ng, Complete Guide to Semiconductor Devices, 2nd ed., Chapter 18 (2002).

Langdo et al., "High Quality Ge on Si by Epitaxial Necking," Applied Physics Letters, vol. 76, No. 25 (Jun. 19, 2000), pp. 3700-3702.

Langdo, "Selective SiGe Nanostructures," Ph.D. Thesis, Massachusetts Institute of Technology (2001).

Lee et al., "Strained-relieved, Dislocation-free $In_xGa_{1-x}As/GaAs(001)$ Heterostructure by Nanoscale-patterned Growth," Applied Physics Letters, vol. 85, No. 18 (Nov. 1, 2004), pp. 4181-4183.

Lee, S.C. et al., "Growth of GaN on a nanoscale periodic faceted Si substrate by metal organic vapor phase epitaxy," 2003 International Symposium on Compound Semiconductors: Post-Conference Proceedings, pp. 15-21.

Li et al, "Heteropitaxy of High-quality Ge on Si by Nanoscale Ge seeds Grown through a Thin Layer of $SiO_2$," Applied Physics Letters, vol. 85, No. 11 (Sep. 13, 2004), pp. 1928-1930.

Li et al., "Defect Reduction of GaAs Epitaxy on Si (001) Using Selective Aspect Ratio Trapping," 91 Applied Physics Letters 021114-1-021114-3 (2007).

Li et al., "Morphological Evolution and Strain Relaxation of Ge Islands Grown on Chemically Oxidized Si(100) by Molecular-beam Epitaxy," J. Applied Physics, vol. 98, (2005), pp. 073504-1-073504-8.

Li et al., "Selective Growth of Ge on Si(100) through vias of $SiO_2$ Nanotemplate Using Solid Source Molecular Beam Epitaxy," Applied Physics Letters, vol. 83, No. 24 (Dec. 15, 2003), pp. 5032-5034.

Liang et al., "Critical Thickness Enhancement of Epitaxial SiGe films Grown on Small Structures," Journal of Applied Physics, vol. 97, (2005) pp. 043519-1-043519-7.

Lim et al., "Facet Evolution in Selective Epitaxial Growth of Si by cold-wall ultrahigh vacuum chemical vapor deposition," J. Vac. Sci. Tech. B 22(2), p. 682 (2004).

Liu et al., "High Quality Single-crystal Ge on Insulator by Liquid-phase Epitaxy on Si Substrates," Applied Physics Letters, vol. 84, No. 14, (Apr. 4, 2004) pp. 2563-2565.

Liu et al., "Rapid Melt Growth of Germanium Crystals with Self-Aligned Microcrucibles on Si Substrates," J. Electrochemical Soc'y, vol. 152, No. 8, (2005) pp. G688-G693.

Loo et al., "Successful Selective Epitaxial $Si_{1-x}Ge_x$ Deposition Process for HBT-BiCMOS and high Mobility Heterojunction pMOS Applications," 150 J. Electrochemical Soc'y 10, pp. G638-G647 (2003).

Lourdudoss, S. et al., "Semi-insulating epitaxial layers for optoelectronic devices," 2000 IEEE International Semiconducting and Insulating Materials Conference, pp. 171-178.

Luan et al., "High-quality Ge Epilayers on Si with Low Threading-dislocation Densities," Applied Phsics Letters, vol. 75, No. 19, (Nov. 8, 1999) pp. 2909-2911.

Luan, "Ge Photodectors for Si Microphotonics," Ph.D. Thesis, Massachusetts Institute of Technology, Feb. 2001.

Lubnow et al., "Effect of III/V-Compound Epitaxy on Si Metal-Oxide-Semiconductor Circuits," Jpn. J. Applied Phys., vol. 33 (1994) pp. 3628-3634.

Luryi et al., "New Approach to the High Quality Epitaxial Growth of Latticed-mismatch Materials," Appl. Phys. Lett., vol. 49, No. 3, (Jul. 21, 1986) pp. 140-142.

Martinez et al., "Characterization of GaAs Conformal Layers Grown by Hydride Vapour Phase Epitaxy on Si Substrates by Microphotoluminescence Cathodoluminescence and microRaman," J. Crystal Growth, vol. 210 (2000) pp. 198-202.

Matsunaga et al., "A New Way to Achieve Dislocation-free Heteroepitaxial Growth by Molecular Beam Epitaxy: Vertical Microchannel Epitaxy," J. Crystal Growth, 237-239 (2002) pp. 1460-1465.

Monroy et al., "High UV/visible contrast photodiodes based on epitaxial lateral overgrown GaN layers," Electronics Letters, vol. 35, No. 17, pp. 1488-1489, Aug. 19, 1999.

Nakano, K. et al., "Epitaxial lateral overgrowth of AlN layers on patterned sapphire substrates," Source: Physica Status Solidi A, v 203, n 7, May 2006, p. 1632-35.

Nam et al., "Lateral Epitaxy of Low Defect Density GaN Layers via Organometallic Vapor Phase Epitaxy," Appl. Phys. Letters, vol. 71, No. 18, (Nov. 3, 1997) pp. 2638-2640.

Naoi et al, "Epitaxial Lateral Overgrowth of GaN on Selected-area Si(111) Substrate with Nitrided Si Mask," Journal of Crystal Growth, vol. 248, (2003) pp. 573-577.

Naritsuka et al., "InP Layer Grown on (001) Silicon Substrate by Epitaxial Lateral Overgrowth," Jpn. J. Appl. Physics, vol. 34 (1995), pp. L1432-L1435.

Naritsuka et al., "Vertical Cavity Surface Emitting Laser Fabricated on GaAs Laterally Grown on Si Substrate," Electrochemical Soc'y Proc. vol. 97-21, pp. 86-90.

Neudeck et al., "Novel silicon epitaxy for advanced MOSFET devices," Electron Devices Meeting, 2000 IEDM Technical Digest, pp. 169-172.

Norman, A.G. et al., "Characterization of MOCVD lateral epitaxial overgrown III-V semiconductor layers on GaAs substrates," Int'l Symposium on Compound Semiconductors, pp. 45-46, Aug. 25-27, 2003.

Parillaud et al, "High Quality InP on Si by Conformal Growth," Appl. Phys. Lett., vol. 68, No. 19 (May 6, 1996) pp. 2654-2656.

Park et al., "Defect Reduction and Its Mechanism of Selective Ge Epitaxy in Trenches on Si(001) Substrates Using Aspect Ratio Trapping," Mat. Res. Soc'y Symp. Proc., vol. 994 (2007).

Park et al., "Defect Reduction of Selective Ge Epitaxy in Trenches on Si(001) Substrates using Aspect Ratio Trapping," 90 Appl. Physics Letters (2007).

Park et al., "Growth of Ge Thick Layers on Si(001) Substrates Using Reduced Pressure Chemical Vapor Deposition," 45 Japanese J. Applied Physics 11, pp. 8581-8585 (2006).

Partial International Search for International Application No. PCT/US2006/033859, 7 pages.

Piffault, N. et al., "Assessment of the strain of InP films on Si obtained by HVPE conformal growth," Sixth Int'l Conference on Indium Phosphide and Related Materials, Conf. Proc., pp. 155-158, Mar. 27-31, 1994.

Pribat et al., "High Quality GaAs on Si by Conformal Growth," Appl. Phys. Lett., vol. 60, No. 17 (Apr. 27, 1992) pp. 2144-2146.

Reed et al., "Realization of a three-terminal resonant tunneling device: the bipolar quantum resonant tunneling transistor," 54 Appl. Phys. Letters 11, p. 1034 (1989).

Ren, D. et al., "Low-dislocation-density, nonplanar GaN templates for buried heterostructure lasers grown by lateral epitaxial overgrowth," Applied Physics Letters, v 86, Mar. 14, 2005, 111901-1-111901-3.

Rim et al., "Fabrication and mobility characteristics of ultra-thin strained Si Directly on Insulator (SSDOI) MOSFETs," 2003 IEDM Tech. Dig., pp. 49-52.

Ringel et al., "Single-junction InGaP/GaAs Solar Cells Grown on Si Substrates with SiGe Buffer Layers," Prog. Photovolt.: Res. & Appl. 2002; 10:417-426.

Sakai, "Defect Structure in Selectively Grown GaN films with low threading dislocation density," Appl. Physics Letters 71(16), pp. 2259-2261 (1997).

Sakai, "Transmission electron microscopy of defects in GaN films formed by epitaxial lateral overgrowth," 73 App. Physics Letters 4, pp. 481-483 (1998).

Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.

Sangwoo Pae et al., "Multiple layers of silicon-on-insulator islands fabrication by selective epitaxial growth," Electron Device Letters, vol. 20, No. 5, pp. 194-196, May 1999.

Schaub, J.D. et al., "Resonant-cavity-enhanced high-speed Si photodiode grown by epitaxial lateral overgrowth," Photonics Technology Letters, vol. 11, No. 12, pp. 1647-1649, Dec. 1999.

Seabaugh et al., "Promise of Tunnel Diode Integrated Circuits," Tunnel Diode and CMOS/HBT Integration Workshop, Dec. 9, 1999, Naval Research Laboratory.

Shahidi, G. et al., "Fabrication of CMOS on ultrathin SOI obtained by epitaxial lateral overgrowth and chemical-mechanical polishing," 1990 IEDM Tech. Dig., pp. 587-590.

Siekkinen, J.W. et al., "Selective epitaxial growth silicon bipolar transistors for material characterization," IEEE Transactions on Electron Devices, vol. 35, No. 10, pp. 1640-1644, Oct. 1988.

Su et al., "Catalytic Growth of Group III-nitride Nanowires and Nanostructures by Metalorganic Chemical Vapor Deposition," Applied Physics Letters, vol. 86 (2005) pp. 013105-1-013105-3.

Su et al., "New planar self-aligned double-gate fully-depleted P-MOSFETs using epitaxial lateral overgrowth (ELO) and selectively grown source/drain (S/D)," IEEE International SOI Conference, 2000, pp. 110-111.

Sun, Y. et al., "Temporally resolved growth of InP in the openings off-oriented from [110] direction," 2000 Int'l Conference on Indium Phosphide and Related Materials, Conf. Proc., pp. 227-230.

Sun, Y.T. et al., "InGaAsP multi-quantum wells at 1.5 μm wavelength grown on indium phosphide templates on silicon," 2003 Int'l Conference on Indium Phosphide and Related Materials, pp. 277-280.

Sun, Y.T.; Lourdudoss, S., "Sulfur doped indium phosphide on silicon substrate grown by epitaxial lateral overgrowth," 2004 Int'l Conference on Indium Phosphide and Related Materials, pp. 334-337.

Sun, Y.T.; Napierala, J.; Lourdudoss, S., "Selective area growth of InP on InP precoated silicon substrate by hydride vapor phase epitaxy," 2002 Int'l Conference on Indium Phosphide and Related Materials, pp. 339-342.

Suryanarayanan, G. et al., "Microstructure of lateral epitaxial overgrown InAs on (100) GaAs substrates," Applied Physics Letters, v 83, n 10, Sep. 8, 2003, pp. 1977-1979.

Takasuka et al., "AlGaAs/InGaAs DFB Laser by One-Time Selective MOCVD Growth on a Grating Substrate," 43 Jap. J. App. Phys. 4B (2004) pp. 2019-2022.

Takasuka et al., "InGaAs/AlGaAs Quantum Wire DFB Buried HeteroStructure Laser Diode by One-Time Selective MOCVD on Ridge Substrate," 44 Jap. J. App. Phys. 4B (2005) pp. 2546-2548.

Tamura et al., "Threading Dislocations in GaAs on Pre-patterned Si and in Post-patterned GaAs on Si," J. Crystal Growth, vol. 147, (1995) pp. 264-273.

Tanaka et al., "Structural Characterization of GaN Laterally Overgrown on a (111) Si Substrate," Applied Physics Letters, vol. 79, No, 7 (Aug. 13, 2001) pp. 955-957.

Tomiya, S. et al.., "Dislocation related issues in the degradation of GaN-based laser diodes," IEEE Journal of Selected Topics in Quantum Electronics, vol. 10, No. 6, pp. 1277-1286, Nov.-Dec. 2004.

Tran et al., "Growth and Characterization of InP on Silicon by MOCVD," J. Crystal Growth, vol. 121, (1992) pp. 365-372.

Tsang, W. et al., "The heteroepitaxial ridge-overgrown distributed feedback laser," IEEE Journal of Quantum Electronics, vol. QE-21, No. 6, pp. 519-526, Jun. 1985.

Tsaur, B.-Y. et al., "Low-dislocation-density GaAs epilayers grown on Ge-coated Si substrates by means of lateral epitaxial overgrowth," Applied Physics Letters, v 41, n 4, Aug. 15, 1982, pp. 347-49.

Tseng et al., "Effects of Isolation Materials on Facet Formation for Silicon Selective Epitaxial Growth," 71 Appl. Phys. Letters 16, p. 2328 (1997).

Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.

Vanamu et al., "Epitaxial Growth of High-quality Ge Films on Nanostructured Silicon Substrates," Applied Physics Letters, vol. 88, (2006) pp. 204104-1-204104-3.

Vanamu et al., "Growth of High Quality $Ge/Si_{1-x}Ge_x$ on Nano-scale Patterned Si Structures," J. Vac. Sci. Techn. B, vol. 23, No. 4, (Jul./Aug. 2005) pp. 1622-1629.

Vanamu et al., "Heteroepitaxial Growth on Microscale Patterned Silicon Structures," J. Crystal Growth, vol. 280, (2005) pp. 66-74.

Vanamu et al., "Improving $Ge/Si_xGe_{1-x}$ Film Quality through Growth onto Patterned Silicon Substrates," Advances in Electronics Manufacturing Technology, V-EMT 1:25 (Nov. 8, 2004), pp. 1-4.

Vetury et al., "First Demonstration of AlGaN/GaN Heterostructure Field Effect Transistor on GaN grown by lateral epitaxial overgrowth (ELO)," Inst. Phys. Conf. Ser. No. 162: Ch. 5, pp. 177-183.

Wemersson et al., "InAs Epitaxial Lateral growth of W Marks," J. Crystal Growth, vol. 280 (2005) pp. 81-86.

Wuu, D.S. et al., "Defect reduction and efficiency improvement of near-ultraviolet emitters via laterally overgrown GaN on a GaN/patterned sapphire template," Applied Physics Letters, v 89, n 16, Oct. 16, 2006, pp. 161105-1-161105-3.

Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.

Xu et al., "Spin-filter devices based on resonant tunneling antisymmetrical magnetic semiconductor hybrid structures," 84 App. Phys. Letters 11, pp. 1955-1957 (2004).

Yamaguchi et al., "Analysis for Dislocation Density Reduction in Selective Area Grown GaAs Films on Si Substrates," Appl. Phys. Lett. vol. 56, No. 1, (Jan. 1, 1990) pp. 27-29.

Yamaguchi et al., "GaAs Solar Cells Grown on Si Substrates for Space Use," Prog. Photovolt.: Res. Appl. 2001; 9:191-201.

Yamaguchi et al., "Super-high-efficiency Multi-junction Solar Cells," Prog. Photovolt.: Res. Appl. 2005; 13:125-132.

Yamaguchi et al., "Defect Reduction Effects in GaAs on Si Substrates by Thermal Annealing," Appl. Phys. Letters 53(23), p. 2293 (1998).

Yamamoto et al., "Optimization of InP/Si Heteroepitaxial Growth Conditions Using Organometallic Vapor Phase Epitaxy," J. Crystal Growth, vol. 96, (1989) pp. 369-377.

Yang et al., "High Performance CMOS Fabricated on Hybrid Substrate with Different Crystal Orientations," 2003 IEDM Tech. Dig., pp. 453-456.

Yang et al., "Selective Area Deposited Blue GaN-InGaN Multiplequantum Well Light Emitting Diodes over Silicon Substrates," Applied Physics Letter, vol. 76, No. 3, (Jan. 17, 2000) pp. 273-275.

Yoon et al., "Selective Growth of Ge Islands on Noanometer-scale Patterned SiO2/Si Substrate by Molecular Beam Epitaxy," Applied Physics Letters, vol. 89 (2006) pp. 063107-1-063107-3.

Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.

Zang, K.Y. et al., "Nanoheteroepitaxial lateral overgrowth of GaN on nanoporous Si(111)," Applied Physics Letters, v 88, n 14, Apr. 3, 2006, p. 141925.

Zang, K.Y. et al., "Nanoscale lateral epitaxial overgrowth of GaN on Si (111)," Applied Physics Letters, v 87, Nov. 7, 2005, p. 193106-1-193106-3.

Zela et al., "Single-crystalline Ge Grown Epitaxially on Oxidized and Reduced Ge/Si (100) Islands," J. Crystal Growth, vol. 263 (2004) pp. 90-93.

Zhang et al., "Removal of Threading Dislocations from Patterned Heteroepitaxial Semiconductors by Glide to Sidewalls," J. Electronic Materials, vol. 27, No. 11, (1998) pp. 1248-1253.

Zhang et al., "Strain Status of Self-assembled InAs Quantum Dots," Applied Physics Letters, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," J. Crystal Growth, v 222, n 4, Feb. 2001, pp. 706-718.

Zubia et al., "Initial Nanoheteroepitaxial Growth of GaAs on Si(100) by OMVPE." J. Electronic Materials, vol. 30, No. 7, (2001) pp. 812-816.

Intel Press Release, "Intel's Tri-Gate Transistor to Enable Next Era in Energy-Efficient Performance," Intel Corporation (Jun. 12, 2006).

Hammerschmidt, "Intel to Use Trigate Transistors from 2009 on," EETIMES Online, available at: http://www.eetimes.com/showArticle.jhtml?articleID=189400035 (Jun. 12, 2006).

Lammers, "Trigate and High-kstack up vs. planar," EETIMES Online, available at: http://www.eetimes.com/showArticle.jhtml?articleID=188703323&pgno=2&printable=true (Jun. 12, 2006).

Intel to Develop Tri-Gate Transistors Based Processors, available at: http://news.techwhack.com/3822/tri-gate-transistors/ (Jun. 13, 2006).

Ames, "Intel Says More Efficient Chips are Coming," PC World, available at: http://www.pcworld.com/printable/article/id,126044/printable.html (Jun. 12, 2006).

Bergman et al., "RTD/CMOS Nanoelectronic Circuits: Thin-Film InP-based Resonant Tunneling Diodes Integrated with CMOS circuits," 20 Electron Device Letters 3, pp. 119-122 (1999).

Cloutier et al., "Optical gain and stimulated emission in periodic nanopatterned crystalline silicon," Nature Materials, Nov. 2005.

Feng et al., "Integration of Germanium-on-Insulator and Silicon MOSFETs on a Silicon Substrate," 27 Electron Device Letters 11, pp. 911-913 (2006).

Fischer et al., "Elastic stress relaxation in SiGe epilayers on patterned Si substrates," 75 Journal of Applied Physics 1, pp. 657-659 (1994).

Fischer et al., "State of stress and critical thickness of Strained small-area SiGe layers," Phys. Stat. Sol. (a) 171, pp. 475-485 (1999).

Fitzgerald et al., "Structure and recombination in InGaAs/GaAs heterostructures," 63 Journal of Applied Physics 3, pp. 693-703 (1988).

Fitzgerald et al., "Totally relaxed $Ge_xSi_{1-x}$ layers with low threading dislocation densities grown on Si Substrates," 59 Applied Physics Letters 7, pp. 811-813 (1991).

Gibbon et al., "Selective-area low-pressure MOCVD of GaInAsP and related materials on planar InP substrates" Semicond Sci Tech. 8, pp. 998-1010 (1993).

International Preliminary Report on Patentability for International Application No. PCT/US2006/019152, dated Nov. 20, 2007.

International Search Report and Written Opinion for International Application PCT/US2007/007373, dated Oct. 5, 2007.

Ismail et al., "High-quality GaAs on sawtooth-patterned Si substrates," 59 Applied Physics Letters 19, pp. 2418-2420 (1991).

Jain et al., "Stresses in strained GeSi stripes and quantum structures: calculation using the finite element method and determination using micro-Raman and other measurements," Thin Solid Films 292 (1997) pp. 218-226.

Neumann et a., "Growth of III V resonant tunneling diode," J. of Crystal Growth (2003).

Prost, W., ed. QUDOS Technical Report 2002-2004.

Sun et al., "Thermal strain in Indium Phosphide on silicon obtained by Epitaxial Lateral Overgrowth," 94 J. of Applied Physics 4, pp. 2746-2748 (2003).

Usuda et al., "Strain relaxation of strained-Si layers on SiGe-on-insulator (SGOI) structures after mesa isolation," Applied Surface Sci. 224, pp. 113-116 (2004).

Usui et al., "Thick GaN Epitaxial Growth with Low Dislocation Density by Hydride Vapor Phase Epitazy," 36 Jap. J. of Applied Physics, pp. L899-L902 (1997).

Vescan et al., "Lateral confinement by low pressure chemical vapor deposition-based selective epitaxial growth of $Si_{1-x}Ge_x/Si$ nanostructures," 81 J. of Applied Physics 10, pp. 6709-6715 (1997).

Choi et al., "Monolithic Integration of Si MOSFET's and GaAs MESFET's," Electron Device Letters, v. EDL-7, No. 4 (1986).

Choi et al., "Monolithic Integration of GaAs/AlGaAs Double-Heterostructure LED's and Si MOSFET's," Electon Device Letters, v. EDL-7, No. 9 (1986).

Choi et al., "Monolithic Integration of GaAs/AlGaAs LED and Si Driver Circuit," 9 Electron Device Letters 10 (1988).

Fiorenza et al., "Film Thickness Constraints for Manufacturable Strained Silicon CMOS," 19 Semiconductor Sci. Technol., pp. L4 (2004).

Hu et al., "Growth of Well-Aligned Carbon Nanotube arrays on Silicon Substrates using Porous Alumina Film as a Nanotemplate," 79 App. Physics Letters 19 (2001).

International Search Report and Written Opinion for International Application No. PCT/US2007/020181, dated Jan. 25, 2008.

International Search Report and Written Opinion for International Application No. PCT/US07/020777, mailed Feb. 8, 2008.

International Search Report and Written Opinion for International Application No. PCT/US2007/019568, mailed Feb. 6, 2008.

Rosenblad et al., "A Plasma Process for Ultrafast Deposition of SiGe Graded Buffer Layers," 76 Applied Physics Letters 4, pp. 427-429 (2000).

Shichijo et al., "Co-Integration of GaAs MESFET & Si CMOS Circuits," 9 Elec. Device. Letters 9 (1988).

Tamura et al., "Heteroepitaxy on high-quality GaAs on Si for Optical Interconnections on Si Chip," Proceedings of the SPIE, vol. 2400, pp. 128-139 (1995).

IPRP for International Application No. PCT/US2006/029247, mailed Feb. 7, 2008.

Bean et al., "$Ge_xSi_{1-x}$/Si strained-later superlattice grown by molecular beam epitaxy," J. Vac. Sci. Tech. A (2)2, pp. 436-440 (1984).

Blakeslee, "The Use of Superlattices to Block the Propogation of Dislocations in Semiconductors," Mat. Res. Soc. Symp. Proc. 148, pp. 217-227.

Currie et al., "Carrier Mobilities and Process Stability of Strained Si n- and p-MOSFETs on SiGe Virtual Substrates," J. Vac. Sci. Tech. B 19(6), pp. 2268-2279 (2001).

Donaton et al., "Design and Fabrication of MOSFETs with a Reverse Embedded SiGe (Rev. e-SiGe) Structure," 2006 IEDM, pp. 465-468.

International Technology Roadmap for Semiconductors- Front End Processes, pp. 1-62 (2005).

IPRP for International Application No. PCT/US2006/033859, mailed Mar. 20, 2008.

Matthews et al., "Defects in Epitaxial Multilayers- Misfit Dislocations," J. Crystal Growth 27, pp. 118-125(1974).

Pidin et al., "MOSFET Current Drive Optimization Using Silicon Nitride Capping Layer for 65-nm Technology Node," 2004 Symp. On VLSI Technology, Dig. Tech. Papers, pp. 54-55.

Rim et al., "Enhanced Hole Mobilities in Surface-channel Strained-Si p-MOSFETs," 1995 IEDM, pp. 517-520.

Thean et al., "Uniaxial-Biaxial Hybridization for Super-Critical Strained-Si Directly on Insulator (SC-SSSOI) PMOS with Different Channel Orientations," IEEE, pp. 1-4 (2005).

Thompson et al., "A Logic Nanotechnology Featuring Strained-Silicon," 25 IEEE Electron Device Letters 4, pp. 191-193 (2004).

Yin et al., "Ultrathin Strained-SOI by Stress Balance on Compliant Substrates and FET Performance," 52 IEEE Trans. on Electron Devices 10, pp. 2207-2214 (2005).

International Preliminary Report on Patentability for International Application No. PCT/US2007/019568, mailed Mar. 19, 2009 (7 pages).

International Preliminary Report on Patentability for International Application No. PCT/US07/021023, mailed Apr. 9, 2009 (8 pages).

International Preliminary Report on Patentability for International Application No. PCT/US2007/020181, mailed Apr. 2, 2009 (9 pages).

International Preliminary Report on Patentability for International Application No. PCT/US07/020777, mailed Apr. 9, 2009 (12 pages).

International Search Report and Written Opinion for International Application No. PCT/US07/022392, mailed Apr. 11, 2008 (20 pages).

Examination Report in European Patent Application No. 06800414.2, mailed Mar. 5, 2009 (3 pages).

Partial International Search Report for International Application No. PCT/US2008/068377, mailed Apr. 7, 2009 (7 pages).

Bogumilowicz et al., "Chemical vapour etching of Si, SiGe and Ge with HCl; applications to the formation of thin relaxed SiGe buffers and to the revelation of threading dislocations," Semicond. Sci. & Tech. 20, pp. 127-134 (2005).

Campo et al., "Comparison of etching processes of silicon and germanium in $SF_6$ -$O_2$ radio-frequency plasma," 13 J. Vac. Sci. Tech. B 2, pp. 235-241 (1995).

International Preliminary Report on Patentability for International Application No. PCT/US07/022392, mailed Apr. 30, 2009 (14 pages).

International Search Report and Written Opinion for International Application No. PCT/US2008/068377, mailed Jul. 6, 2009 (19 pages).

Oehrlein et al., "Studies of the reactive ion etching of SiGe alloys, " 9 J. Vac. Sci. Tech. A 3, pp. 768-774 (1991).

Partial International Search Report for International Application No. PCT/US2008/004564, mailed Jul. 30, 2009 (9 pages).

Williams et al., "Etch rates for micromachining processing, " 5 J. Microelectromechanical Sys, 4, pp. 256-269 (1996).

Williams et al., "Etch rates for micromachining processing—Part II, " 12 J. Microelectromechanical Sys. 6, pp. 761-777 (2003).

* cited by examiner

US 7,799,592 B2

TRI-GATE FIELD-EFFECT TRANSISTORS FORMED BY ASPECT RATIO TRAPPING

RELATED APPLICATION

This application claims the benefit of and priority to U.S. Provisional Application Ser. No. 60/847,424 filed Sep. 27, 2006, the entire disclosure of which is hereby incorporated by reference in its entirety.

FIELD OF THE INVENTION

This invention relates generally to semiconductor processing and particularly to the formation of tri-gate field-effect transistors.

BACKGROUND

Due to the increasing difficulty in shrinking complementary metal-oxide-semiconductor (CMOS) transistor gate lengths while simultaneously controlling leakage current, the traditional single-gate metal-oxide-semiconductor field-effect transistor (MOSFET) structure (where the inversion layer is formed only in the plane of the wafer surface) may be supplanted by dual- or triple-gate MOSFET structures. These structures, by increasing the gate's control of the channel potential, allow greater ability to turn off MOSFETs with ultra-short channel lengths. Of the various multi-gate MOSFETs structures explored in recent years, the most promising in terms of manufacturability and performance are typically variations of the so-called "FinFET" structure; these variations are known by such terms as "Tri-gate," "Omega-FET," or "MuGFET." Generally, for each of these device types, a strip or "fin" of silicon (Si) is formed; subsequently the gate material is deposited and etched, so that the resulting gate surrounds the fin on the three exposed sides. The channel region of the device is located in the fin. To introduce strain into such a strip or fin, researchers have explored process-inducement methods similar to those employed in single-gate MOSFETs, such as, for example, epitaxially raised silicon germanium (SiGe) or silicon carbide (SiC) source and drain regions. There are, however, limitations to such methods, including limitations on how much strain can be introduced into the channel.

SUMMARY

In various embodiments, the invention includes methods and structures for introducing strain into FinFET-type devices by exploiting differences in natural lattice constants between the channel region in the fin and a substantially relaxed semiconductor region below the channel.

Accordingly, an aspect of the invention features a method for forming a structure. The method includes forming a dielectric layer over a semiconductor substrate comprising a first semiconductor material. A trench is defined in the dielectric layer, extending to a surface of the substrate, and having a height h and a width w; the ratio of h to w is preferably $\geq 0.5$.

A crystalline material is formed in the trench. The crystalline material includes (i) a first layer comprising a second semiconductor material and (ii) a second layer comprising a third semiconductor material. A majority of dislocation defects in the crystalline material terminate within the trench. A portion of the dielectric layer is removed to expose a side portion of the crystalline material, and a gate is defined over the crystalline material.

One or more of the following features may be included. The second and third semiconductor materials may have different lattice constants; the difference between lattice constants may be less than 1%. The second semiconductor material may be relaxed and the third semiconductor material may be strained. Removing a portion of the dielectric layer may include exposing at least a portion of a sidewall of the second layer. The second semiconductor material may include SiGe, and/or the third semiconductor material may include at least one of Si and Ge.

The second semiconductor material may have a bandgap of at least 0.5 eV. It may include at least one of a III-V compound, such as aluminum antimonide (AlSb), indium aluminum antimonide (InAlSb), gallium antimonide (GaSb), or a II-VI compound, such as cadmium selenide (CdSe), zinc telluride (ZnTe), or cadmium telluride (CdTe).

The third semiconductor material may have a bulk electron mobility greater than 2000 $cm^2/V \cdot s$ and may include at least one of indium antimonide (InSb), indium arsenide (InAs), or indium gallium arsenide (InGaAs).

In another aspect, the invention features a method for forming a structure, in which a dielectric layer is formed over a semiconductor substrate including a first semiconductor material. A trench is defined in the dielectric layer, extending to a surface of the substrate, and having a height h and a width w; the ratio of h to w is preferably $\geq 0.5$. A. At least one crystalline material layer including a second semiconductor material having a lattice mismatch with the first semiconductor material is formed in the trench, such that a majority of dislocation defects in the second semiconductor material terminate within the trench. A portion of the dielectric layer is removed to expose a side portion of the crystalline material, and a gate is defined over the crystalline material.

One or more of the following features may be included. The second semiconductor material may include at least one of a III-V compound or a II-VI compound. The second semiconductor material may have a bandgap of at least 0.5 eV and/or have a bulk electron mobility greater than 2000 $cm^2/V \cdot s$.

The crystalline material layer(s) may include a first layer comprising the second semiconductor material and a second layer comprising a third semiconductor material. The third semiconductor material may include at least one of a III-V compound or a II-VI compound, and the third semiconductor material may be different from the second semiconductor material. The second and third semiconductor materials may have different lattice constants. The second semiconductor material may be relaxed and the third semiconductor material may be strained. The third semiconductor material may include at least one element contained in the second semiconductor material. Defining the dielectric layer may include thermal oxidation and/or plasma-enhanced chemical vapor deposition (PECVD).

In yet another aspect, the invention features a method for forming a structure, including removing a portion of a semiconductor substrate comprising a first semiconductor material to define a fin. A dielectric layer is deposited over the substrate and the fin, and then planarized such that a top surface of the dielectric layer is substantially co-planar with a top surface of the fin. A trench is formed by removing at least a portion of the fin, the trench has a height h and a width w, and the ratio of h to w is preferably $\geq 0.5$. A crystalline material is formed in the trench, and includes a second semiconductor material lattice-mismatched to the first semiconductor material. A majority of dislocation defects in the crystalline material terminating within the trench. A portion of the dielectric layer is removed to expose a side portion of the crystalline material, and a gate is defined over the second semiconductor material.

In still another aspect, the invention features a structure having a strained channel and including multiple semiconductor material layers at least partially disposed in a trench. The structure includes a dielectric layer disposed over a semiconductor substrate comprising a first semiconductor material. A trench is disposed in the dielectric layer. The trench (i) extends to a surface of the substrate, (ii) is defined by at least one sidewall having a height h at least equal to a predetermined distance H from the surface of the substrate, and (iii) has a width w. A crystalline material is at least partially disposed in the trench. The crystalline material includes a first layer comprising a second semiconductor material and a second layer comprising a third semiconductor material. A side portion of the crystalline material extends above the dielectric layer, and a gate is disposed over the crystalline material. The ratio of the height h to the width w is $\geq 0.5$, and a majority of dislocation defects in the crystalline material terminate at or below the predetermined vertical distance H (with $h \geq H$). The third semiconductor material defines a strained channel.

In another aspect, a semiconductor device includes a transistor structure formed above a defect trapping region. The semiconductor device includes a defect-trapping region comprising a trench including a dielectric sidewall. The defect-trapping region is proximate a substrate having a first lattice constant. A semiconductor material, disposed within the defect trapping region, has a second lattice constant different from the first lattice constant. A majority of crystalline defects in the semiconductor material terminate within the defect trapping region. A fin having a semiconducting sidewall is disposed above the semiconductor material disposed within the defect trapping region, and a transistor gate is disposed over the semiconducting sidewall and top surface of the fin.

Still another aspect of the invention features a method for forming a structure. The method includes the steps of forming a dielectric layer over a semiconductor substrate that itself includes a first semiconductor material, and defining a trench in the dielectric layer extending to a surface of the substrate. The trench is defined by at least one sidewall having a height h at least equal to a predetermined distance H from the surface of the substrate; the trench is substantially rectangular and has a width w. A crystalline material including a first layer and a second layer is formed in the trench. The first layer includes a second semiconductor material, and the second layer includes a third semiconductor material. A portion of the dielectric layer is removed to expose a side portion of the crystalline material, and a gate is defined over the crystalline material. The ratio of the height h of the trench to the width w of the trench is $\geq 0.5$, e.g., $\geq 1$, and dislocation defects in the crystalline material terminate at the sidewall of the trench at or below the predetermined distance H ($h \geq H$).

The second and third semiconductor materials may have different lattice constants. The second semiconductor material may be relaxed and the third semiconductor material may be strained. Removing a portion of the dielectric layer may include exposing at least a portion of a sidewall of the second layer. The second semiconductor material may comprise SiGe, and the third semiconductor material may include at least one of Si and Ge.

The second semiconductor material may have a bandgap of at least 0.5 eV. The second semiconductor material may include at least one of a III-V material and a II-VI material, e.g., at least one of AlSb, InAlSb, GaSb, CdSe, ZnTe, and CdTe.

The third semiconductor material may have a bulk electron mobility greater than 2000 cm$^2$/V·s. The third semiconductor material may include at least one of InSb, InAs, and InGaAs. The difference between a lattice constant of the second semiconductor material and a lattice constant of the third semiconductor material may be less than 1%.

In another aspect, the invention features a method for forming a structure. The method includes removing a portion of a semiconductor substrate including a first semiconductor material to define a fin, and depositing a dielectric layer over the substrate and the fin. The dielectric layer is planarized such that a top surface of the dielectric layer is substantially co-planar with a top surface of the fin. A trench is defined by removing at least a portion of the fin. The trench has at least one sidewall having a height h at least equal to a predetermined distance H from the bottom of the trench. The trench is substantially rectangular and has a width w. A crystalline material including a second semiconductor material is formed in the trench. A portion of the dielectric layer is removed to expose a side portion of the crystalline material, and a gate is defined over the second semiconductor material. The ratio of the height h of the trench to the width w of the trench is $\geq 0.5$, e.g., $\geq 1$, and dislocation defects in the crystalline material terminate at the sidewall of the trench at or below the predetermined distance H, and $h \geq H$.

In another aspect, the invention features a structure including a dielectric layer disposed over a semiconductor substrate that itself includes a first semiconductor material. A trench is disposed in the dielectric layer and extends to a surface of the substrate. The trench is defined by at least one sidewall having a height h at least equal to a predetermined distance H from the surface of the substrate. The trench is substantially rectangular and has a width w. A crystalline material is at least partially disposed in the trench. The crystalline material comprises a first layer including a second semiconductor material and a second layer including a third semiconductor material. A side portion of the second layer extends above the dielectric layer, and a gate is disposed over the crystalline material. The ratio of the height h of the trench to the width w of the trench is $\geq 0.5$, e.g., $\geq 1$, dislocation defects in the crystalline material terminate at the sidewall of the trench at or below the predetermined distance H, $h \geq H$, and the third semiconductor material defines a strained channel.

The second and third semiconductor materials may have different lattice constants. The second semiconductor material may be relaxed and the third semiconductor material may be strained. In some embodiments, the second semiconductor material may include SiGe and the third semiconductor material may include at least one of Si and Ge.

In another aspect, the invention features a structure including a dielectric layer disposed over a semiconductor substrate that itself includes a first semiconductor material. A trench is disposed in the dielectric layer and extends to a surface of the substrate. The trench is defined by at least one sidewall having a height h at least equal to a predetermined distance H from the surface of the substrate. The trench is substantially rectangular and has a width w. A crystalline material is at least partially disposed in the trench. The crystalline material comprises a first layer including a second semiconductor layer and a second layer including a third semiconductor material. A side portion of the second layer extends above the dielectric layer, and a gate is disposed over the crystalline material. The ratio of the height h of the trench to the width w of the trench is $\geq 0.5$, e.g., $\geq 1$, dislocation defects in the crystalline material terminate at the sidewall of the trench at or below the predetermined distance H, $h \geq H$, and the second semiconductor material has a bandgap of at least 0.5 eV.

The second semiconductor material may include at least one of a III-V material and a II-VI material, e.g., at least one of AlSb, InAlSb, GaSb, CdSe, ZnTe, or CdTe. The third semiconductor material may have a bulk electron mobility greater than 2000 cm$^2$/V·s, and may include, e.g., at least one of InSb, InAs, and InGaAs. The difference between a lattice constant of the second semiconductor material and a lattice constant of the third semiconductor material may be less than 1%.

BRIEF DESCRIPTION OF FIGURES

In the drawings, like reference characters generally refer to the same features throughout the different views. Also, the drawings are not necessarily to scale, emphasis instead being placed upon illustrating the principles of the invention.

DETAILED DESCRIPTION

Figure 1:
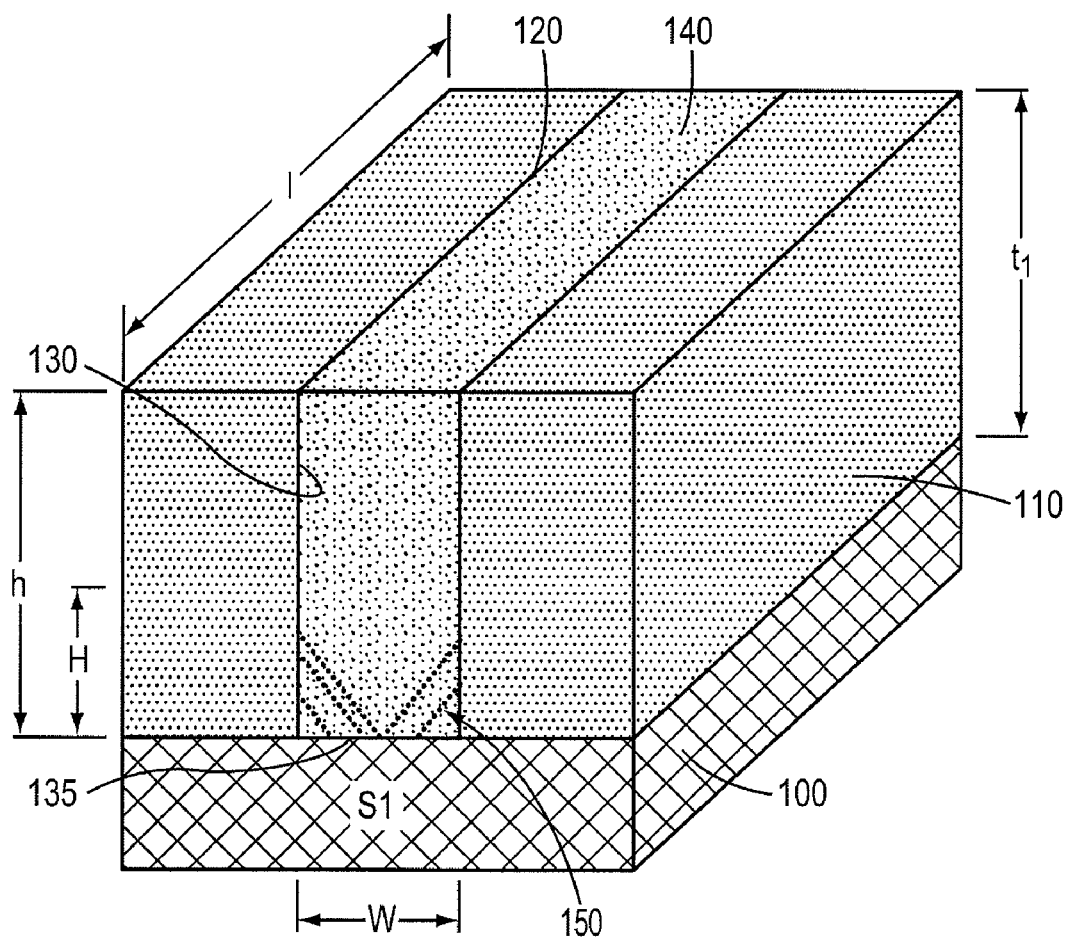
FIGS. 1-2 are schematic perspective views illustrating a method for formation of a device on a semiconductor substrate in accordance with an aspect of the invention.

Referring to FIG. 1, a substrate 100 includes a first semiconductor material S1. The substrate 100 may be, for example, a bulk Si wafer, a bulk germanium (Ge) wafer, a semiconductor-on-insulator (SOI) substrate, or a strained semiconductor-on-insulator (SSOI) substrate. The substrate 100 may include or consist essentially of the first semiconductor material, such as a group IV element, e.g., Ge or Si, a III-V compound, or a II-VI compound. In an embodiment, substrate 100 includes or consists essentially of (100) Si.

A dielectric layer 110 is formed over the semiconductor substrate 100. The dielectric layer 110 may include or consist essentially of a dielectric material, such as silicon nitride ($Si_3N_4$) or silicon dioxide ($SiO_2$). The dielectric layer 110 may be formed by any suitable technique, e.g., thermal oxidation or PECVD. As discussed below, the dielectric layer may have a thickness $t_1$ corresponding to a desired height h of crystalline material to be deposited in a trench formed through the dielectric layer. In some embodiments, the thickness $t_1$ of the dielectric layer 110 may be in the range of, e.g., 25-1000 nm.

A mask (not shown), such as a photoresist mask, is formed over the substrate 100 and the dielectric layer 110. The mask is patterned to expose at least a portion of the dielectric layer 110. The exposed portion of the dielectric layer 110 is removed by, e.g., reactive ion etching (RIE) to define a defect trapping region, e.g., trench 120. Trench 120 extends to a surface of the substrate 100 and may be defined by at least one sidewall 130. The height h of the sidewall 130 corresponds to the thickness $t_1$ of the dielectric layer 110, and may be at least equal to a predetermined vertical distance H from a top surface 135 of the substrate, calculated as described below.

It has been observed experimentally that dislocations in a mismatched cubic semiconductor grown on a Si (100) surface in the near vicinity (e.g., within approximately 500 nm or less) of a vertical dielectric sidewall surface bend toward that surface at approximately 30 degrees through 60 degrees. For example, the dislocations may bend toward that surface at approximately a 45-degree angle to that surface. Based on this relationship, the predetermined vertical distance H necessary to trap defects is, typically, approximately equal to a width between ½ w and 2 w, where w is the width of the trench. This range is based on the range of intersection angles of approximately 30 degrees through 60 degrees; then, tan(30°)w≦H≦tan(60°)w, which roughly corresponds to ½ w≦H≦2 w.

The trench may be substantially rectangular in terms of cross-sectional profile, a top view, or both, and have a width w that is smaller than a length l of the trench. For example, the width w of the trench may be less than about 500 nm, e.g., about 10-100 nm, and the length l of the trench may exceed each of w and H. The ratio of the height h of the trench to the width w of the trench 120 may be ≧0.5, e.g., ≧1.

A crystalline material 140 is formed in the trench 120. The crystalline material 140 may include or consist essentially of a group IV element or compound, a III-V compound, or a II-VI compound. Examples of suitable group IV elements or compounds include Ge, Si, SiGe, and SiC. Examples of suitable III-V compounds include gallium arsenide (GaAs), gallium nitride (GaN), InAs, InSb, InAlSb, AlSb, indium aluminum arsenide (InAlAs), indium phosphide (InP), and InGaAs. Examples of suitable II-VI compounds include CdSe, ZnTe, and CdTe.

The crystalline material 140 may be formed by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In the CVD process, selective epitaxial growth typically includes introducing a source gas into the chamber. The source gas may include at least one precursor gas and a carrier gas, such as, for example, hydrogen. The reactor chamber may be heated by, for example, RF-heating. The growth temperature in the chamber may range from about 300° C. to about 900° C., depending on the composition of the crystalline material. The growth system may also utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, an Aixtron 2600 multi-wafer system available from Aixtron, based in Aachen, Germany; an EPI CENTURA single-wafer multi-chamber systems available from Applied Materials of Santa Clara, Calif.; or an EPSILON single-wafer epitaxial reactor available from ASM International based in Bilthoven, The Netherlands.

Dislocation defects 150 in the crystalline material 140 reach and terminate at the sidewalls of the trench 120 in the dielectric material 110 at or below the predetermined vertical distance H from the surface 135 of the substrate, such that dislocations in the crystalline material 140 decrease in density with increasing distance from the bottom portion of the trench 120. Accordingly, the upper portion of the crystalline material is substantially exhausted of dislocation defects. Various dislocation defects such as threading dislocations, stacking faults, twin boundaries, or anti-phase boundaries may thus be substantially eliminated from the upper portion of the crystalline material.

A planarization step such as, e.g., CMP may be used to ensure that the top surface of the crystalline material 140 is substantially co-planar with the top surface of the dielectric material 110.

Figure 2:
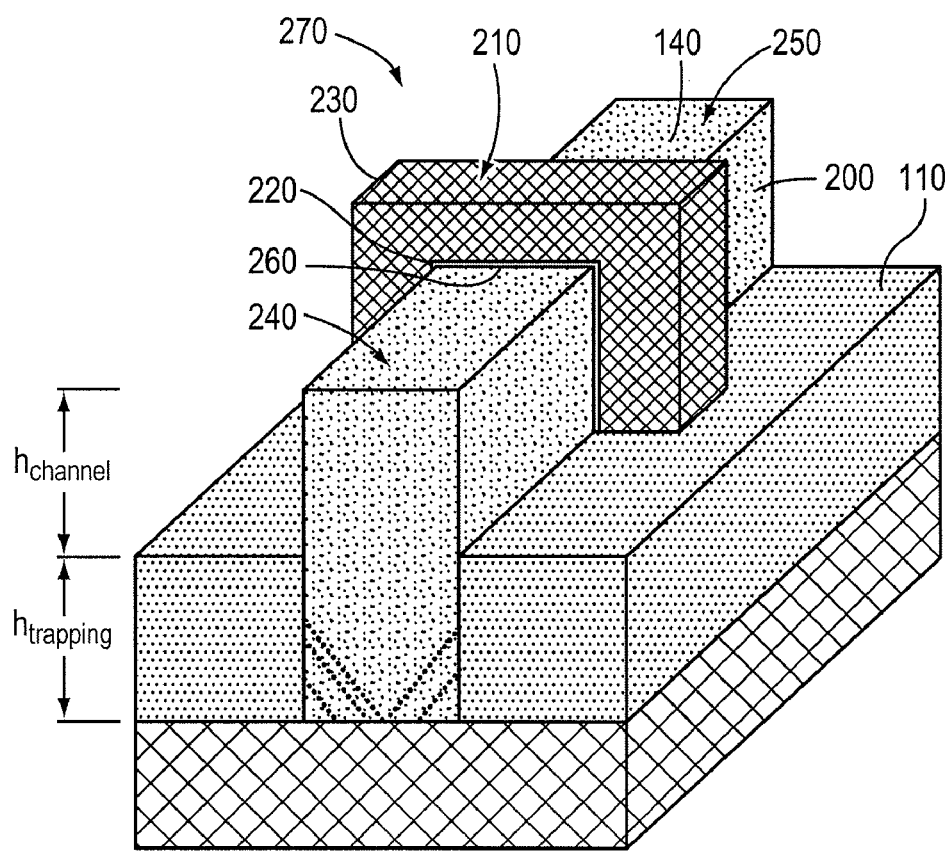

Referring to FIG. 2, a portion of the dielectric layer 110 is selectively removed to expose a side portion 200 of the crystalline material 140. A height $h_{channel}$ of the exposed side portion 200 may be equivalent to the thickness of a channel region to be formed. Preferably, the portion of the dielectric layer 110 is removed by an isotropic etch, e.g., a wet etch employing, for example, HF. A dry etch may also be used, e.g., a plasma etch employing $CF_4$ and $H_2$.

The crystalline material 140 may be considered as having two portions: a lower portion for trapping dislocation defects and an upper portion for a channel portion of a tri-gate MOSFET incorporating the crystalline material 140. The height h of the crystalline material thus has two components: the height $h_{trapping}$ of the lower portion (where defects are concentrated) and the height $h_{channel}$ of the upper portion (which is largely free of defects). The height $h_{trapping}$ of the trapping portion may be selected from a range of about ½ $w \leq h_{trapping} \leq 2$ w, to ensure effective trapping of dislocation defects. The actual value of $h_{trapping}$ required may depend upon the type of dislocation defects encountered, which, in turn, may depend on the materials used, and also upon the orientation of the trench sidewalls. In some instances, the height $h_{trapping}$ need not be greater than that required for effective defect trapping, in order to ensure that the dislocation defects are trapped at a sufficient distance away from the channel portion. In this way, the deleterious effects of dislocation defects upon device performance are not experienced. For example, $h_{trapping}$ may be, e.g., 10-100 nm greater than required for effective trapping of defects. For the channel portion, the height $h_{channel}$ may typically be selected from the range of approximately ½ $w \leq h_{channel} \leq 10$ w. In some cases, if $h_{channel}$ is significantly less than ½ w, the device may no longer be considered a multi-gate device, i.e., if conduction occurs primarily on the top surface of the gates disposed over the channel portion. If $h_{channel}$ is significantly greater than 10 w, subsequent device processing may be challenging, for example, because of possible mechanical instability of the fin during processing, or because of challenges in implanting ions in sidewalls of closely packed devices that include tall fins.

A gate 210 is defined over the crystalline material 140 by deposition and selective removal of a gate dielectric material 220 and a conductive gate material 230. The gate dielectric material may be, e.g., $SiO_2$, $Si_3N_4$, $HfO_2$, HfSiON, and/or HfSiO. The conductive gate material 230 may be, for example, polysilicon, amorphous Si, Ge, or SiGe gate material, or a metal or metal alloy. In a tri-gate device, gate 210 has three portions, one on each exposed side portion of the crystalline material 140 and one on a top surface of the crystalline material 140.

A source and a drain may be defined in source and drain regions 240, 250 of the crystalline material 140 proximate to the gate 210 and next to a channel 260 disposed under the gate 210. The resulting structure is a tri-gate MOSFET 270, employing the benefits of aspect ratio trapping ("ART"). As used herein, "ART" refers generally to the technique(s) of causing defects in a material to terminate on a side surface as the material grows vertically, e.g., at a dielectric sidewall, with the sidewall being sufficiently high with respect to a width of the growth area, such that it traps most, if not all, of the defects.

Figure 4:
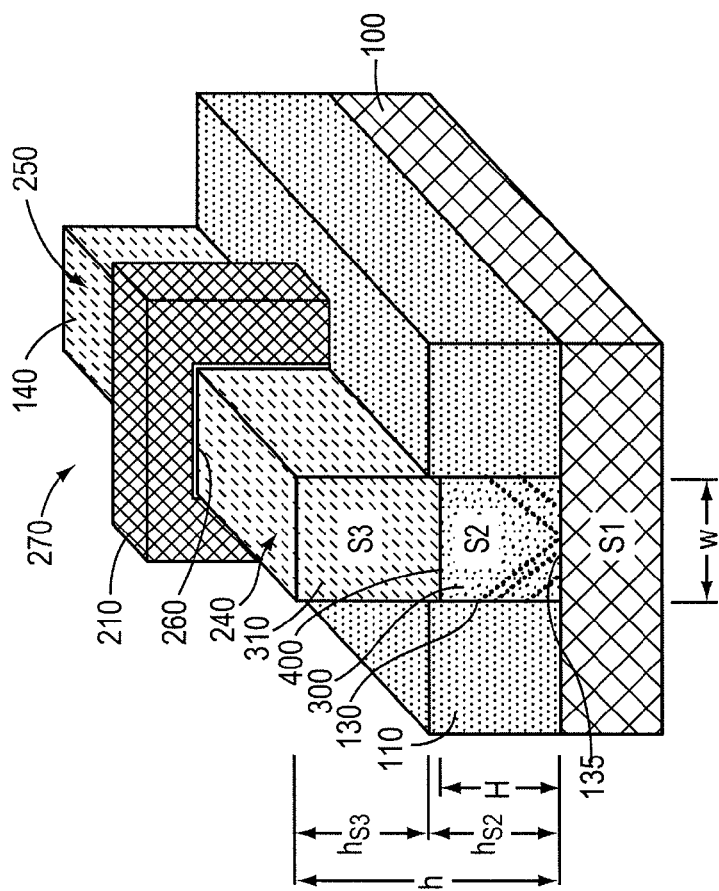
FIGS. 3-4 are schematic perspective views illustrating an alternative method for formation of a device on a semiconductor substrate in accordance with other aspects of the invention.
Figure 3:
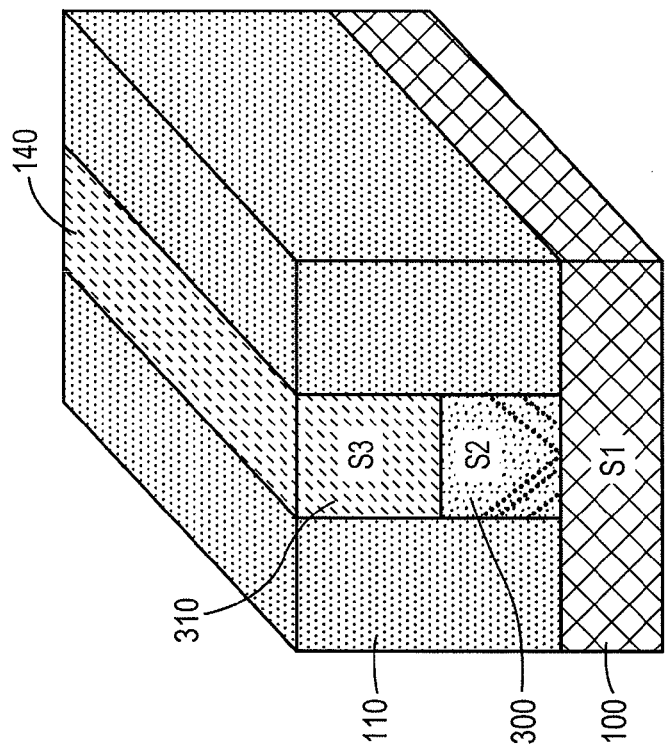

Referring to FIGS. 3 and 4, in some embodiments, the crystalline material 140 includes a first layer 300 and a second layer 310. The first layer 300 includes a second semiconductor material S2, and the second layer 310 includes a third semiconductor material S3. Each of the semiconductor material S2, S3 may include or consist essentially of one or more of a group IV element or compound, a III-V compound, or a II-VI compound. Examples of suitable group IV elements or compounds include Ge, SiGe, and SiC. Examples of suitable III-V compounds include GaAs, GaN, InAs, InSb, InAlSb, AlSb, InAlAs, rip, and InGaAs. Examples of suitable II-VI compounds include CdSe, ZnTe, and CdTe.

In an embodiment, the second and third semiconductor materials S2, S3 may be different materials having different lattice constants. The lattice mismatch may be selected from a range of, e.g., 0.2-4.0%. If the lattice mismatch is too low, the benefit to performance may not be significant. If the lattice mismatch is too high, the allowable thickness of the third semiconductor material S3 may be too limited, if gross relaxation of third semiconductor material S3 is to be avoided. The second semiconductor material S2 may be relaxed and the third semiconductor material S3 may be strained.

In one embodiment, the second semiconductor material S2 includes or consists essentially of relaxed SiGe, and the third semiconductor material S3 includes or consists essentially of Si. This combination results in tensile strain in the channel 260. The strain may be primarily uniaxial in the direction of current flow due to lateral elastic relaxation. This type of strain is particularly beneficial for n-type metal-oxide-semiconductor (NMOS) device performance.

In another embodiment, the second semiconductor material includes or consists essentially of relaxed SiGe, and the third semiconductor material S3 includes or consists essentially of Ge. This combination results in compressive strain in the channel 240. The strain may be primarily uniaxial in the direction of current flow due to lateral elastic relaxation. This type of strain is particularly beneficial for p-type metal-oxide-semiconductor (PMOS) device performance.

The resulting tri-gate MOSFET 270 or FinFET (FIG. 4) includes dielectric layer 110 disposed over the semiconductor substrate 100 including the first semiconductor material S1. Trench 120 is disposed in the dielectric layer 110, extends to the surface 135 of the substrate 100, and is defined by at least one sidewall 130. The sidewall 130 has a height h at least equal to a predetermined distance H from the surface of the substrate. The trench is substantially rectangular and has a width w. Crystalline material 140 is at least partially disposed in the trench. The crystalline material comprises a first layer 300 that includes a second semiconductor material, and a second layer 310 that includes a third semiconductor material. A side portion of the second layer extends above the dielectric layer. Gate 210 is disposed over the crystalline material. A ratio of the height h of the trench to the width w of the trench is preferably $\geq 0.5$, dislocation defects in the crystalline material terminate at the sidewall of the trench at or below the predetermined distance H, $h \geq H$, and the third semiconductor material defines a strained channel 260.

A height $h_{S2}$ of the first layer 300 may be approximately equal to $h_{trapping}$, and a height $h_{S3}$ of the second layer 310 may be approximately equal to $h_{channel}$, with $h_{trapping}$ and $h_{channel}$ being determined as discussed above with reference to FIG. 2. The height of the first layer $h_{S2}$ and the height of the second layer $h_{S3}$ may be selected so that the second semiconductor material S2 is relaxed and the third semiconductor material S3 is strained, or vice versa.

The following relationships may be taken into consideration when selecting $h_{S2}$ and $h_{S3}$. For compressively strained films, substantial relaxation occurs at a film thickness of approximately 3-4 times $h_c$, where $h_c$ is the critical thickness for the appearance of misfit dislocations. For tensilely strained films, substantial relaxation occurs at a film thickness of about 10 $h_c$.

Referring still to FIGS. 3 and 4, in another embodiment, the second and third semiconductor materials S2, S3 may be selected to allow the formation of a bi-layer tri-gate device with high-mobility channel material and suppressed junction leakage. For example, the second semiconductor material S2 may have a bandgap of at least 0.5 eV. The second semiconductor material S2 may include or consist essentially of a III-V material and/or a II-VI material, such as AlSb, InAlSb, GaSb, CdSe, ZnTe, and/or CdTe. The third semiconductor material S3 may have a high bulk electron mobility, e.g., greater than 2000 $cm^2/V\cdot s$. Materials that are suitable for NMOS and have high mobilities include, e.g., InSb, InAs, and InGaAs.

For some potential III-V channel materials, straining the channel may not lead to significant performance benefits. In such cases, preferably the second semiconductor material S2 and the third semiconductor material S3 have similar lattice constants. Matching lattice constants helps avoid significant defect formation at an interface 400 between these two materials, while also allowing a sufficient height $h_{S3}$ (e.g., 20-200 nm) of the second layer 310 to make this layer suitable for use as a MOS channel. In a preferred embodiment, the difference between the lattice constant of the second semiconductor material and the lattice constant of the third semiconductor material is less than 1%.

In forming the tri-gate device 270, a source and a drain are defined in source and drain regions 240, 250, respectively. Preferably, bottom portions of the source and the drain are disposed in second semiconductor material S2, such that the relatively high bandgap of second semiconductor material S2 helps limit junction leakage.

Figure 6:
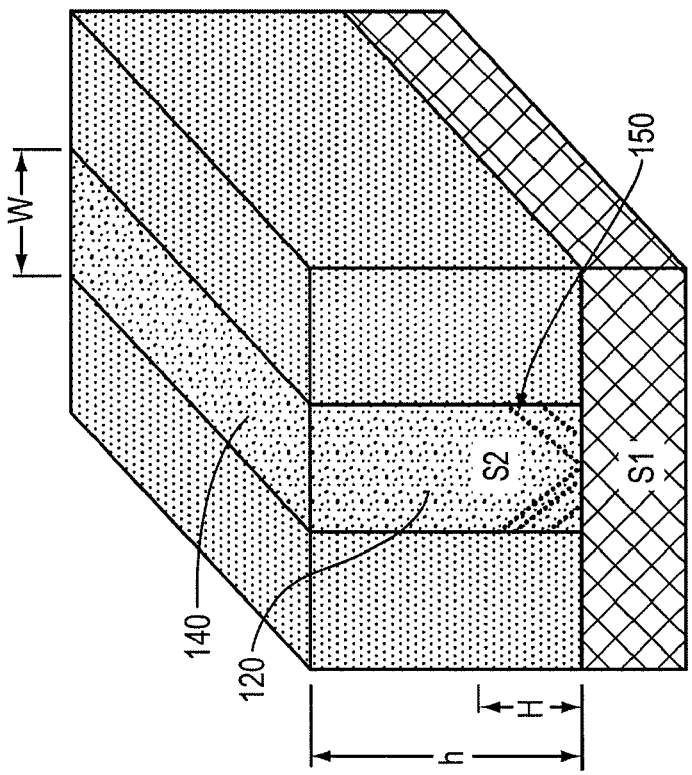
FIGS. 5-7 are schematic perspective views illustrating another alternative method for formation of a device on a semiconductor substrate in accordance with another aspect of the invention.
Figure 5:
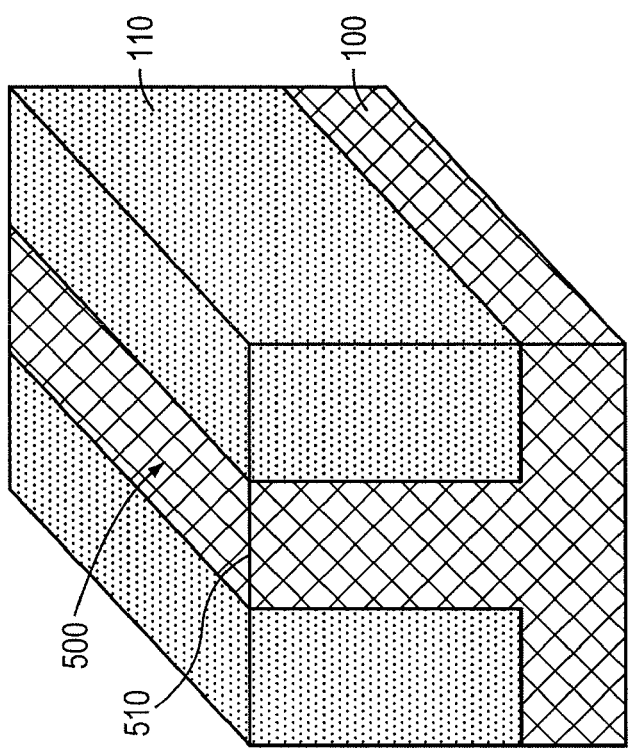
Figure 7:
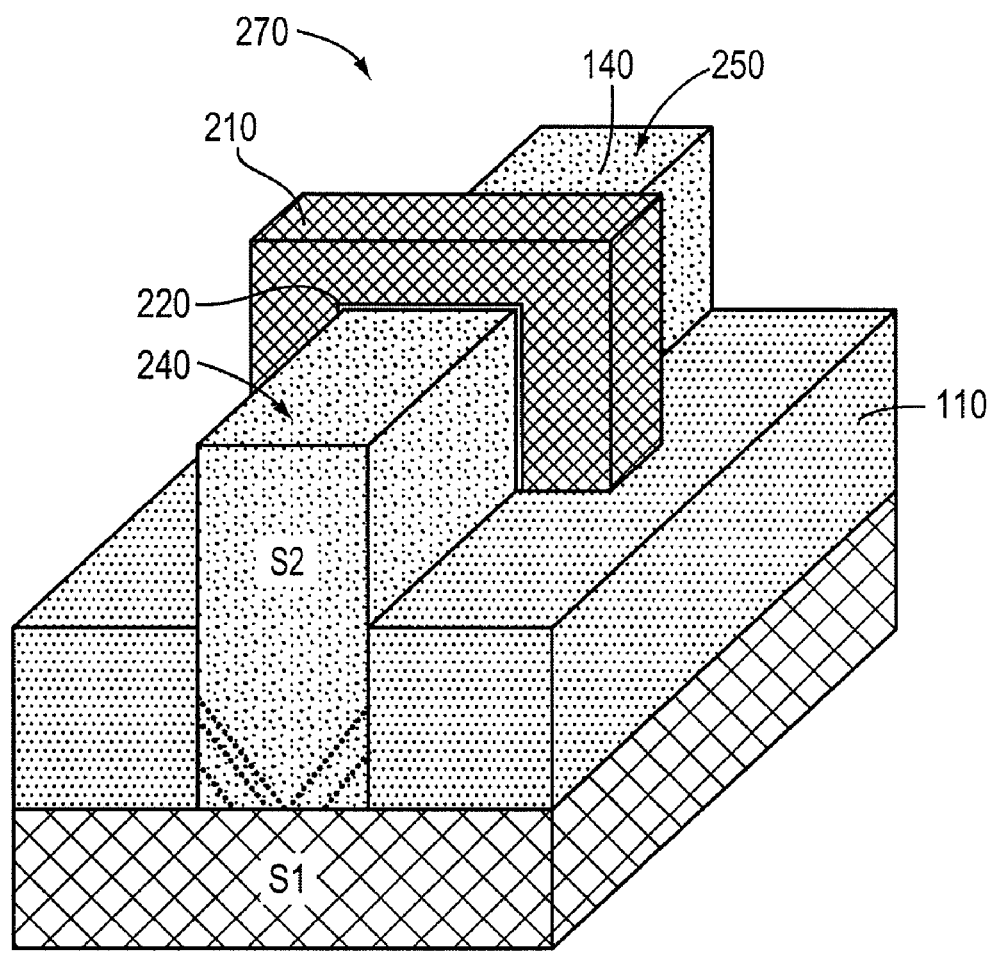

Referring to FIGS. 5-7, in some circumstances, from the standpoint of photolithography, it may be easier to define a narrow line than a narrow trench. Accordingly, an alternative process sequence for creating trench 120 begins with formation of a mask (not shown) over semiconductor substrate 100. A portion of the semiconductor substrate 100 is removed to define a fin 500. Fin 500 may have dimensions substantially identically to the dimensions of trench 120. Dielectric layer 110 is deposited over the semiconductor substrate 100 and the fin 500. The dielectric layer 110 is then planarized by, e.g., chemical-mechanical polishing (CMP) such that a top surface of the dielectric layer is substantially co-planar with a top surface 510 of the fin 500.

Trench 120 is defined by removing at least a portion of the fin 500. The fin may be selectively removed with a wet or dry etch that removes semiconductor material S1 with respect to the dielectric layer 110. For example, if semiconductor material S1 primarily comprises Si, and dielectric layer 110 primarily comprises $SiO_2$, a dry etch utilizing $Cl_2$ and/or HBr may be used to selectively remove the Si. The etch may be a timed etch, thereby avoiding undercutting a bottom portion of the dielectric layer 110.

As discussed above with respect to FIG. 1, trench 120 is defined by at least one sidewall having a height h at least equal to a predetermined distance H from the bottom of the trench. The trench may be substantially rectangular and have a width w. The ratio of the height h of the trench to the width w of the trench is preferably $\geq 1$, dislocation defects in the crystalline material terminate at the sidewall of the trench at or below the predetermined distance H, and $h \geq H$. A crystalline material 140 is formed in the trench. The crystalline material includes second semiconductor material S2.

Referring to FIG. 7, a portion of the dielectric layer 110 is removed to expose a side portion of the crystalline material. A gate dielectric 220 and a gate 210 are formed over the second semiconductor material S2, to define a FinFET.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a structure, the method comprising the steps of:
    forming a dielectric layer over a semiconductor substrate comprising a first semiconductor material;
    defining a trench in the dielectric layer, the trench (i) extending to a surface of the substrate, and (ii) having a height h and a width w, the ratio of h to w being $\geq 0.5$;
    forming, in the trench, a crystalline material including a first layer comprising a second semiconductor material and a second layer comprising a third semiconductor material, a majority of dislocation defects in the crystalline material terminating within the trench;
    removing a portion of the dielectric layer to expose a side portion of the crystalline material; and
    defining a gate over the crystalline material.

2. The method of claim 1, wherein the second and third semiconductor materials have different lattice constants.

3. The method of claim 2, wherein the second semiconductor material is relaxed and the third semiconductor material is strained.

4. The method of claim 1, wherein removing a portion of the dielectric layer comprises exposing at least a portion of a sidewall of the second layer.

5. The method of claim 1, wherein the second semiconductor material comprises SiGe.

6. The method of claim 5, wherein the third semiconductor material comprises at least one of Si and Ge.

7. The method of claim 1, wherein the second semiconductor material has a bandgap of at least 0.5 eV.

8. The method of claim 7, wherein the second semiconductor material includes at least one of a III-V compound or a II-VI compound.

9. The method of claim 8, wherein the second semiconductor material comprises at least one of AlSb, InAlSb, GaSb, CdSe, ZnTe, or CdTe.

10. The method of claim 1, wherein the third semiconductor material has a bulk electron mobility greater than 2000 $cm^2/V\cdot s$.

11. The method of claim 10, wherein the third semiconductor material comprises at least one of InSb, InAs, or InGaAs.

12. The method of claim 1, wherein a difference between a lattice constant of the second semiconductor material and a lattice constant of the third semiconductor material is less than 1%.

13. A method for forming a structure, the method comprising the steps of:
    forming a dielectric layer over a semiconductor substrate comprising a first semiconductor material;
    defining a trench in the dielectric layer, the trench (i) extending to a surface of the substrate, and (ii) having a height h and a width w, the ratio of h to w being $\geq 0.5$;
    forming, in the trench, at least one crystalline material layer comprising a second semiconductor material having a lattice mismatch with the first semiconductor material, a majority of dislocation defects in the second semiconductor material terminating within the trench;

removing a portion of the dielectric layer to expose a side portion of the crystalline material; and defining a gate over the crystalline material.

14. The method of claim 13, wherein the second semiconductor material includes at least one of a III-V compound or a II-VI compound.

15. The method of claim 13, wherein the second semiconductor material has a bandgap of at least 0.5 eV.

16. The method of claim 13, wherein the second semiconductor material has a bulk electron mobility greater than 2000 cm$^2$/V·s.

17. The method of claim 13, wherein the at least one crystalline material layer includes a first layer comprising the second semiconductor material and a second layer comprising a third semiconductor material.

18. The method of claim 17, wherein the third semiconductor material comprises at least one of a III-V compound or a II-VI compound, and the third semiconductor material is different from the second semiconductor material.

19. The method of claim 17, wherein the second and third semiconductor materials have different lattice constants.

20. The method of claim 17, wherein the second semiconductor material is relaxed and the third semiconductor material is strained.

21. The method of claim 17, wherein the third semiconductor material includes at least one element contained in the second semiconductor material.

22. The method of claim 13, wherein defining the dielectric layer comprises at least one of thermal oxidation or PECVD.

23. A method for forming a structure, the method comprising:

removing a portion of a semiconductor substrate comprising a first semiconductor material to define a fin;

depositing a dielectric layer over the substrate and the fin;

planarizing the dielectric layer such that a top surface thereof is substantially co-planar with a top surface of the fin;

defining a trench by removing at least a portion of the fin, the trench having a height h and a width w, the ratio of h to w being $\geq 0.5$;

forming, in the trench, a crystalline material comprising a second semiconductor material lattice-mismatched to the first semiconductor material, a majority of dislocation defects in the crystalline material terminating within the trench;

removing a portion of the dielectric layer to expose a side portion of the crystalline material; and defining a gate over the second semiconductor material.

* * * * *